United States Patent [19]

Vickery et al.

[11] 4,224,631

[45] Sep. 23, 1980

[54] SEMICONDUCTOR VOLTAGE REFERENCE DEVICE

[75] Inventors: Earl C. Vickery; James C. Schmoock; Clyde M. Brown, Jr., all of San Jose, Calif.

[73] Assignee: Raytheon Company, Lexington, Mass.

[21] Appl. No.: 954,390

[22] Filed: Oct. 25, 1978

[51] Int. Cl.³ ............................................. H01L 29/90
[52] U.S. Cl. ...................................... 357/13; 357/88; 357/90
[58] Field of Search ............................ 357/13, 90, 88

[56] References Cited

U.S. PATENT DOCUMENTS

| 4,051,504 | 9/1977 | Hille | 357/13 |
| 4,079,402 | 3/1978 | Dunkly | 357/13 |
| 4,127,859 | 11/1978 | Nelson | 357/13 |

Primary Examiner—Martin H. Edlow

Attorney, Agent, or Firm—Richard M. Sharkansky; Joseph D. Pannone

[57] ABSTRACT

A semiconductor voltage reference device formed by ion implanting particles into a semiconductor body having first and second doped regions of opposite type conductivity formed therein. Such particles are implanted with a peak concentration at a predetermined depth from a surface of the body, providing a third region of conductivity type opposite that of the first region and having a doping concentration greater than that of the second region. The particles extend beneath the surface of the body into the first and second regions, a junction being formed between the first and third regions beneath the surface of the body. Electrodes are provided in ohmic contact with the first and second doped regions. When the junction is reverse biased by applying a proper voltage across the electrodes the junction breaks down beneath the surface of the body establishing a fixed or reference voltage between the electrodes.

4 Claims, 9 Drawing Figures

SEMICONDUCTOR VOLTAGE REFERENCE DEVICE

BACKGROUND OF THE INVENTION

This invention relates generally to semiconductor voltage reference devices.

As is known in the art, types of semiconductor voltage reference devices are so-called Zener or avalanche devices. Such devices have been made in monolithic integrated circuits using the emitter-base junction of an N-P-N transistor. In particular, a P-type conductivity base region is diffused through a surface of an N-type conductivity epitaxial layer formed on a P-type conductivity silicon wafer and an N-type conductivity emitter region is then diffused into the base region through the same surface. A P-N junction is then formed between the base-emitter regions, and when a proper voltage is applied across the junction the junction breaks down to establish the reference or Zener voltage. Unfortunately, this junction breakdown occurs along the surface of the silicon and, therefore, the precise breakdown or reference voltage is susceptible to surface effects, thereby affecting the accuracy of the reference voltage. Further, the breakdown voltage or reference voltage is generally relatively noisy and does not have relatively long-term stability, thereby limiting its effectiveness. Still further, because the surface is especially sensitive to contamination in an oxide layer generally formed on the surface, or at the silicon-silicon dioxide interface, short term stabilities and "turn on" drift may result in the reference voltage, thereby adversely affecting the usefulness of such a device in many applications.

A subsurface device has been suggested to reduce the surface effects described above. One such device is described in a paper entitled "Monolithic Temperature Stabilized Voltage Reference with 0.5 ppm/° Drift" by Robert C. Dobkin, 1966 IEEE International Solid-State Circuits Conference, pgs. 108–109. As discussed therein, a deep P+ type conductivity region is diffused into an N-type conductivity silicon wafer, such diffusion then being covered by a standard base diffusion followed by an N+ type conductivity emitter diffusion which covers the deep P+ type conductivity diffusion. The diode is then broken down in the region where the dopant concentration is greatest, that is, across the junction formed between the P+ and N+ type conductivity regions. While such device may be useful in some applications, the use of diffusion processing in fabricating the base and deep P+ type conductivity regions requires careful control to achieve reference voltage variations of less than ±250 mV from run-to-run in a wafer production line thereby making such device impractical in many applications when such device is to be produced on a production basis.

SUMMARY OF THE INVENTION

In accordance with the present invention, a semiconductor device is formed by ion implanting particles into a semiconductor body having a first doped region formed therein, such particles being implanted with a peak concentration at a predetermined depth from a surface of such body, providing a second region of conductivity type opposite that of the conductivity type of the first region beneath the surface of the body, and extending into portions of the first region, a junction being formed between the first and second regions beneath such surface.

In a preferred embodiment of the invention, the first doped region is diffused into the body, such first doped region having an inner periphery enclosing a portion of the body. A third doped region is diffused into a portion of the body enclosed by the first doped region. Such third doped region is separated from the first doped region and has a conductivity type opposite that of the first doped region. The second doped region extends beneath the surface of the body into the third region and into portions of the first region, forming a junction with the first doped region. Electrodes are in ohmic contact with the first and third doped regions. When the junction is reverse biased by applying a proper voltage to the electrodes, the junction between the first doped region and the second doped region breaks down or avalanches, producing a fixed or reference voltage across the electrodes.

BRIEF DESCRIPTION OF THE DRAWINGS

The foregoing features of this invention as well as the invention itself may be more fully understood from the following detailed description read together in connection with the accompanying drawings in which.

DESCRIPTION OF THE PREFERRED EMBODIMENTS

Figure 1A:
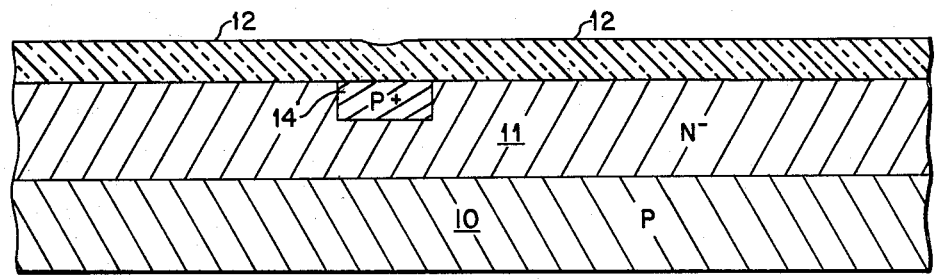
FIGS. 1A through 1F are schematic cross-sectional elevation views of a portion of a semiconductor device according to the invention at various steps in the manufacture thereof.

Referring now to FIG. 1A, a wafer 10 of P-type silicon having a resistivity here in the order of 10–20 ohm-cm and N-type epitaxial layer 11 formed thereon in any conventional manner is shown. Here the thickness of the epitaxial layer 11 is in the order of 14 μm and has a resistivity in the order of 5 ohm-cm (i.e., a doping concentration of $9 \times 10^{14}$ atoms/cm$^3$.) The upper surface of the epitaxial layer 11 has an insulating layer 12, here of silicon dioxide, deposited thereon using any conventional process, here by thermal oxidation. Here the thickness of the silicon dioxide layer 12 is in the order of 10,000 Å. An aperture is formed in the layer 12 using conventional photolithographic-chemical etching techniques, and a region 14 of P+ type conductivity is formed in the epitaxial layer 11 as shown by diffusing a suitable dopant, here boron, into such epitaxial layer 11 through the aperture. The depth of the diffused P+ type conductivity region 14 is here in the order of 30,000 Å from the surface of the epitaxial layer 11. The P+ type conductivity region 14 here has a sheet resistance in the order of 100 ohms per square and a doping concentration in the order of $10^{19}$ atoms per cm$^3$. It is noted that a thin layer of silicon dioxide, here in the order of 5000 Å thick, grows over the aperture during the diffusion process.

Figure 1B:
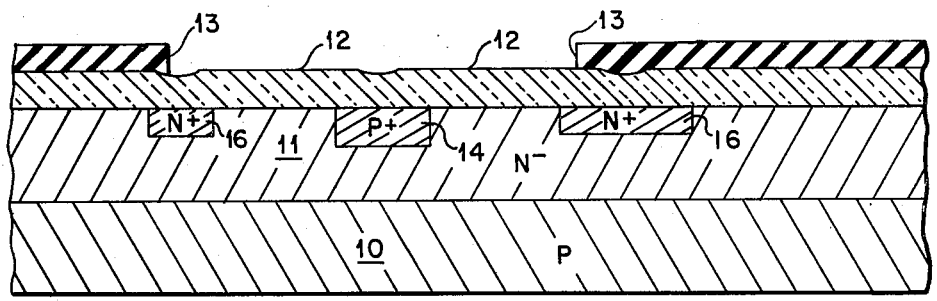
Figure 2:
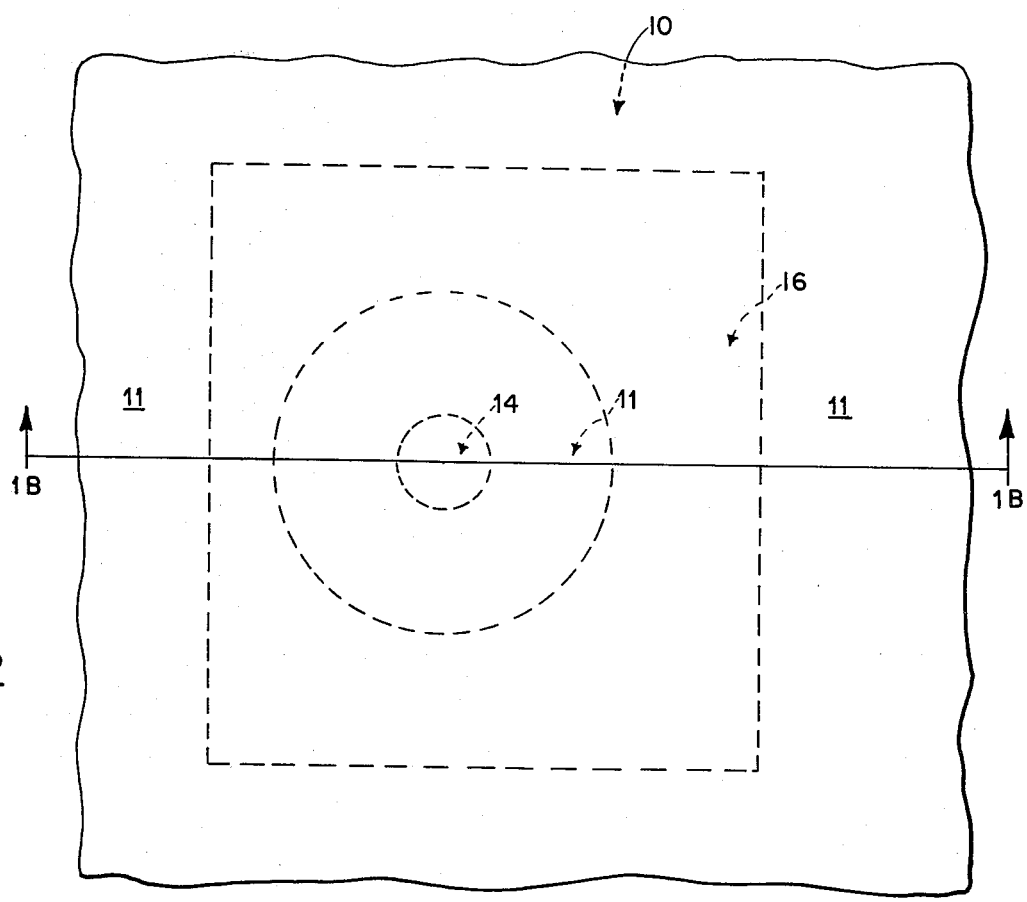
FIG. 2 is a plan view of the semiconductor device at one stage in the manufacture thereof.

Referring now to FIG. 1B, an N+ type conductivity region 16 is formed in the epitaxial layer 11 as shown by diffusing phosphorous into such epitaxial layer through apertures formed in the silicon dioxide layer 12 using conventional photolithographic, masking, and diffusion processes. Here the concentration of phosphorous atoms in the N+ type conductivity region 16 is in the order of $10^{21}$ atoms per $cm^3$. The depth of the P+ type conductivity region 16 here is in the order of 25,000 Å from the surface of the epitaxial layer 11. It is noted that the N+ type conductivity region 16 encircles the P+ type conductivity region 14 as shown in FIG. 2. (It is noted that the cross-sectional view in FIG. 1B is taken along line 1B—1B shown in FIG. 2.) A photoresist layer 13 is deposited over the silicon dioxide layer 12 and is patterned as shown into a mask using conventional photolithographic techniques. The portions of the silicon dioxide layer 12 exposed by the photoresist layer 13 are removed using a suitable chemical etchant.

Figure 1C:
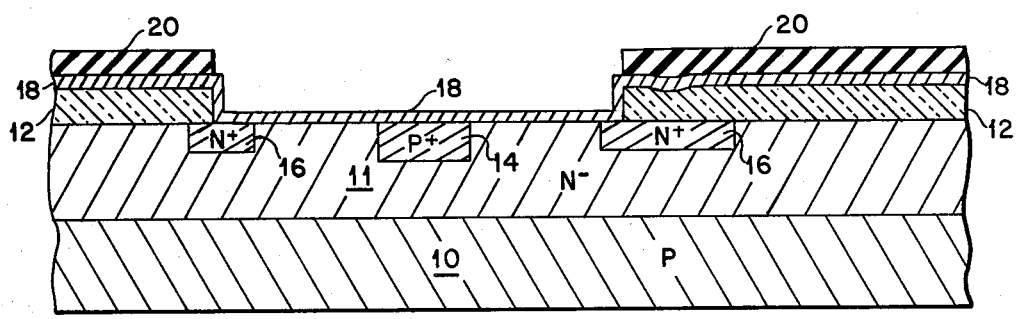
Figure 1D:
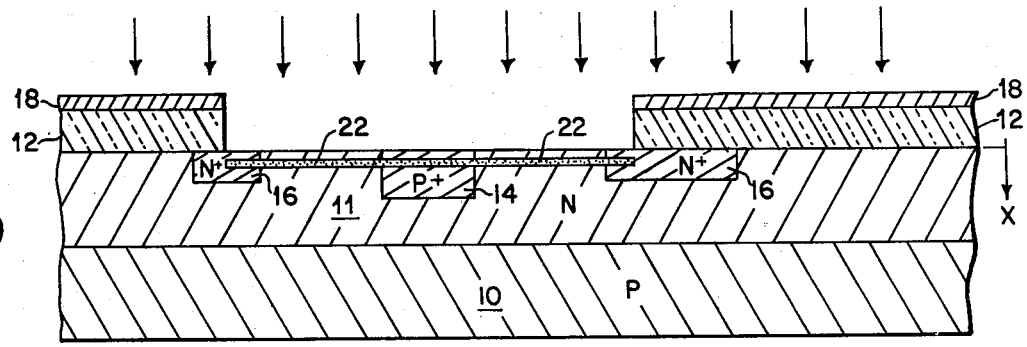

Referring now to FIG. 1C, the photoresist layer 13 is removed in any conventional manner and a metal layer 18, here aluminum, is evaporated over the surface of the remaining silicon dioxide layer 12 and over the exposed portions of the surface of the epitaxial layer 11, as shown. Here the thickness of the aluminum layer 18 is in the order of 10,000 Å. Next, a layer 20 of photoresist is deposited over the aluminum layer and is patterned to provide a mask, as shown, using conventional etching and processing techniques to cover selected portions of the aluminum layer 18. A suitable chemical etchant, here phosphoric acid, is used to remove portions of the aluminum layer 18 exposed by the photoresist layer 20 as shown in FIG. 1D. The photoresist layer 20 is then removed using any conventional technique.

Figure 4:
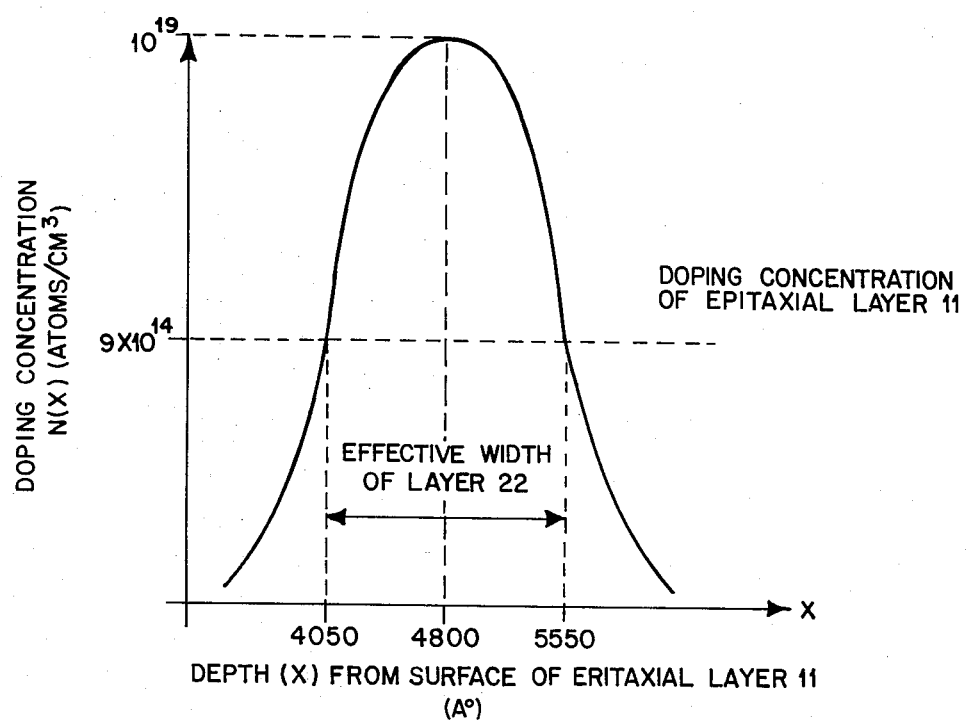
FIG. 4 is a curve showing the doping concentration of a buried layer formed by ion implantation of particles beneath the surface of the semiconductor device as a function of depth from a surface of such device.

Next, boron atoms are ion implanted beneath the portion of the epitaxial layer 11 which is unmasked by the aluminum layer 18 and silicon dioxide layer 12 to form a buried layer 22 as shown in FIG. 1D. Here dosage is in the order of $3 \times 10^{14}$ atoms/$cm^2$, and the boron atoms are implanted here using an energy level in the order of 180 KeV. The peak concentration of the boron atoms is here in the order of $1 \times 10^{19}$ atoms/$cm^3$ and the peak concentration is at a depth of 4800 Å from the surface of the epitaxial layer 11 as shown in FIG. 4. It is noted that the peak concentration is greater than the concentration of the P+ region 14. The effective width of the buried layer 22 is here in the order of 1500 Å as shown in FIG. 4. It is noted that the buried layer 22 extends beneath the surface of the epitaxial layer through the P+ type conductivity region 14 and into portions of the N+ type conductivity region 16.

Figure 1E:
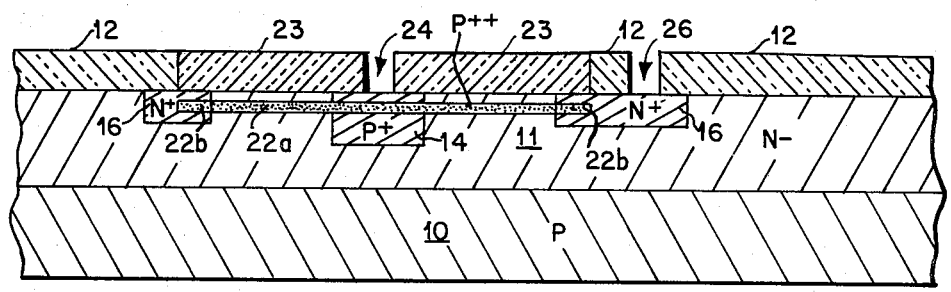
Figure 3:
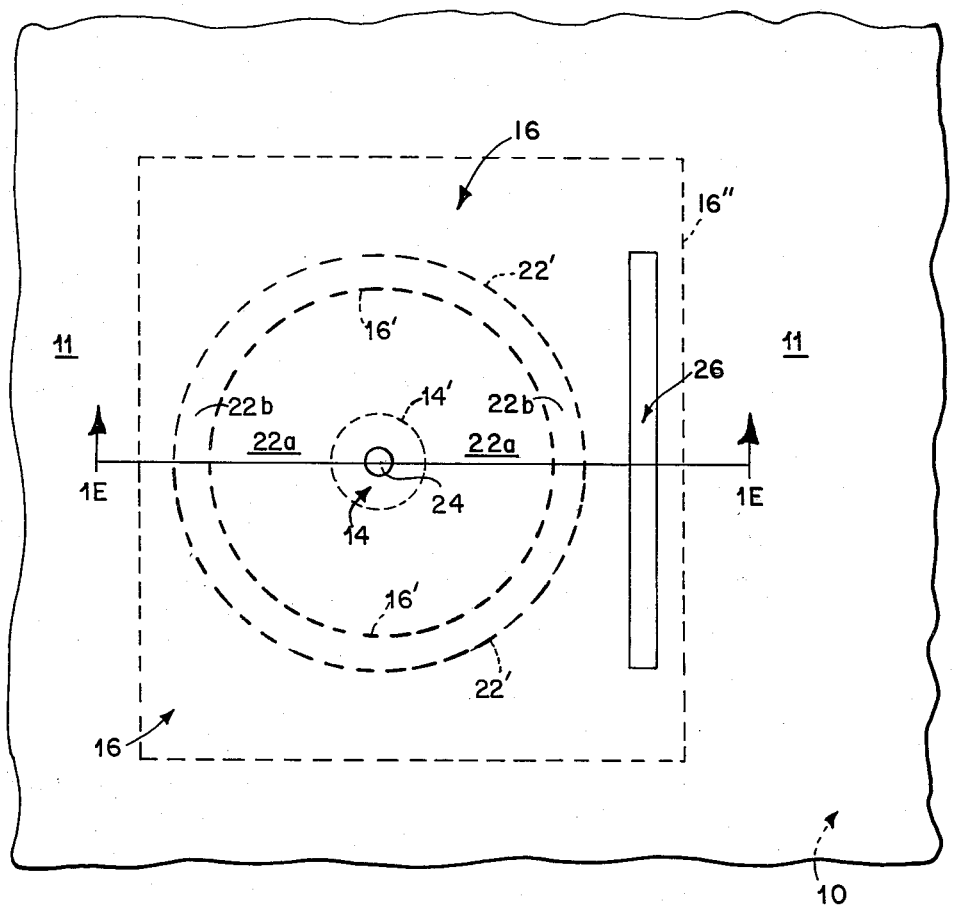
FIG. 3 is a plan view of the semiconductor device at another stage in the manufacture thereof.

Referring now to FIG. 1E, the remaining portions of the aluminum layer 18 are removed using a suitable chemical etchant, here phosphoric acid. The wafer is then heated to a temperature in the order of 1050° C. for a period of time in the order of 15 minutes to anneal and thereby activate the implanted boron atoms to form P type conductivity dopant in region 22. It is noted that the P type conductivity doping concentration in the portion 22b of the region 22 (which is in the N+ type region 16) is in the order of $1 \times 10^{19}$ atoms/$cm^3$, whereas the N+ type dopant in such region 16 is in the order of $10^{21}$ atoms/$cm^3$. Therefore, the portion 22b of region 22 remains as N-type conductivity. The portion 22a of region 22 is P++ type conductivity. Therefore, a P-N junction is thereby formed between the buried P++ type conductivity portion 22a of region 22 and the N+ type conductivity region 16. It is also noted that during the annealing process a layer 23 of silicon dioxide is formed over the exposed portions of the epitaxial layer 11. Here the thickness of the regrown silicon dioxide layer 23 is in the order of 10,000 Å. Next, contact windows are formed in the silicon dioxide layers 12, 23 using conventional photolithographic-chemical etching techniques to expose portions of the P+ type conductivity region 14 and the N+ type conductivity region 16 as shown. A plan view of the device thus formed is shown in FIG. 3. (It is noted that the cross-sectional view of FIG. 1E is taken along the line 1E—1E shown in FIG. 3.). The outer periphery of the buried layer 22 is designated by the numeral 22' in FIG. 3. The inner periphery of the N+ type conductivity region 16 is designated by the numeral 16' in FIG. 3, and the outer periphery of such N+ type conductivity region 16 is designated by the numeral 16'' in FIG. 3. The outer periphery of the P+ type conductivity region 14 is designated by the numeral 14' in FIG. 3.

Figure 1F:
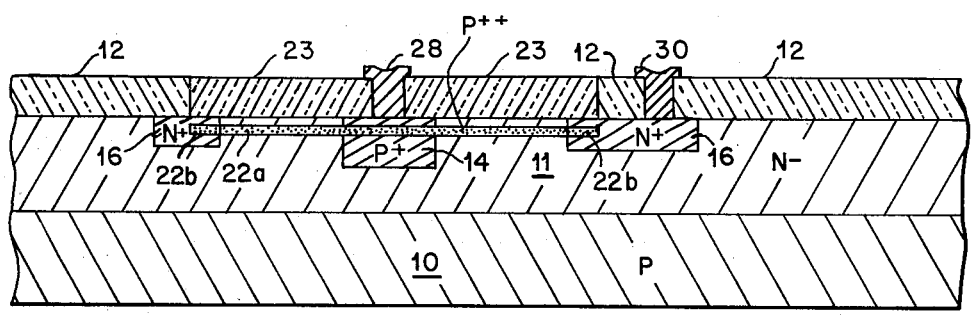

Completing the device and referring to FIG. 1F, a metal layer, here aluminum, is evaporated over the surface of the silicon dioxide layers 12, 23 and into the portions of the N+ type conductivity region 14 and P+ type conductivity region 16 exposed by contact windows 26, 24, respectively. Such metal layer is then patterned into electrical contacts 28, 30 as shown using conventional photolithographic chemical etching techniques. The contact 28 provides the anode for the device, and the contact 30 provides the cathode for the device. When a reverse bias voltage source of sufficient voltage level is connected to contacts 28, 30, current flows between the P+ type conductivity region 14 and the N+ type conductivity region 16, through the buried P++ type conductivity region 22a, the junction between the P++ region 22a and the N+ region 16 breaks down or avalanches, causing a fixed or reference voltage to be produced across the electrodes 28, 30. It is noted that the junction breaks down where the doping concentration is greatest, i.e., between the P++ portion 22a of region 22 and the N+ region 16 and, hence, beneath the surface of the epitaxial layer 11. It should be noted that the separation between the P+ region 14 and the N+ region 16 is selected to prevent the formation of a P-N junction which breaks down along the surface of the epitaxial layer 11.

Having described a preferred embodiment of the invention, it is now evident that other embodiments incorporating these concepts may be used. It is felt, therefore, that this invention should not be restricted to the disclosed embodiment but, rather, should be limited only by the spirit and scope of the appended claims.

What is claimed is:

1. A semiconductor device comprising:
   (a) a semiconductor body having a first type conductivity;
   (b) a first doped region formed within such body having such first type conductivity and a doping concentration greater than the doping concentration of the body, such first region having an inner periphery enclosing a portion of the body;
   (c) a second doped region having a type conductivity opposite the first type conductivity formed within the inner periphery of the first region and being separated from the first region by a portion of the semiconductor body, the second doped region having a doping concentration less than the doping concentration of the first doped region;
   (d) a region of particles disposed within the body having a peak concentration at a predetermined depth from a surface of the body and extending beneath the surface of the body into the second doped region and into the first doped region, such particles establishing a third doped region having a doping concentration less than the doping concentration of the first doped region, thereby terminating the third doped region at the first doped region, a junction being formed between the third doped region and the first doped region beneath the surface of the body.

2. The semiconductor device recited in claim 1 wherein the first doped region and the third doped region have opposite conductivity types.

3. The semiconductor device recited in claim 2 wherein the doping concentration of the third doped region is greater than the doping concentration of the second doped region.

4. The semiconductor device recited in claim 3 including additionally electrodes in ohmic contact with the first and second regions.

* * * * *

UNITED STATES PATENT OFFICE
CERTIFICATE OF CORRECTION

Patent No. 4,224,631     Dated September 23, 1980

Inventor(s) Earl C. Vickery, James C. Schmoock and Clyde M. Brown, Jr.

It is certified that error appears in the above-identified patent and that said Letters Patent are hereby corrected as shown below:

Column 3, line 30, delete --FIG. 1D-- and replace with --FIG. 2D--.

Signed and Sealed this

Twenty-first Day of April 1981

[SEAL]

Attest:

RENE D. TEGTMEYER

Attesting Officer     Acting Commissioner of Patents and Trademarks